United States Patent
Nakaji

(10) Patent No.: US 6,738,185 B2
(45) Date of Patent: May 18, 2004

(54) OPTICAL AMPLIFIER GAIN CONTROL METHOD FOR OPTICAL AMPLIFIER AND GAIN CONTROL CIRCUIT FOR OPTICAL AMPLIFIER

(75) Inventor: Haruo Nakaji, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 19 days.

(21) Appl. No.: 10/231,442

(22) Filed: Aug. 30, 2002

(65) Prior Publication Data

US 2004/0042065 A1 Mar. 4, 2004

(51) Int. Cl.[7] .................................. H01S 3/00
(52) U.S. Cl. .................................. 359/341.41
(58) Field of Search ................... 359/341.41, 341.42

(56) References Cited

U.S. PATENT DOCUMENTS

| 5,703,711 | A | * | 12/1997 | Hamada | 359/341 |
| 5,923,462 | A | | 7/1999 | van der Plaats | |
| 6,246,514 | B1 | * | 6/2001 | Bonnedal et al. | 359/341 |
| 6,366,393 | B1 | | 4/2002 | Feulner et al. | |
| 6,366,395 | B1 | | 4/2002 | Drake et al. | |

FOREIGN PATENT DOCUMENTS

| JP | 05-063643 | | 3/1993 |
| JP | 10-51395 | * | 2/1998 |
| JP | 2000-040847 | | 2/2000 |

OTHER PUBLICATIONS

2000 Research & Development Report "Research & Development Of Whole Optical Communication Technology", May 2001.

* cited by examiner

Primary Examiner—Mark Hellner
(74) Attorney, Agent, or Firm—McDermott, Will & Emery

(57) ABSTRACT

The invention relates to an optical amplifier capable of achieving high-speed gain control in a wide dynamic range with a simpler constitution. A gain control circuit of the optical amplifier includes a first photodetector for outputting a voltage having a linear relation with power of part of signal light to be inputted to the optical amplifier medium, a second photodetector for outputting a voltage having a linear relation with power of part of the signal light amplified in the optical amplifier medium, a comparator for outputting a difference between the voltages respectively outputted from the first and second photodetectors, and a drive circuit for supplying a desired drive current to a pumping light source in response to the voltage outputted from the comparator. Each of the first and second photodetectors includes a photoelectric conversion element for performing conversion into an electric current in response to inputted optical power, and an operational amplifier for converting the electric current outputted from the photoelectric conversion element into a voltage. Particularly, at least one of the first and second photodetectors includes an adjusting mechanism for adjusting an offset of the outputted voltage.

22 Claims, 5 Drawing Sheets

OPTICAL AMPLIFIER GAIN CONTROL METHOD FOR OPTICAL AMPLIFIER AND GAIN CONTROL CIRCUIT FOR OPTICAL AMPLIFIER

BACKGROUND OF THE INVENTION

1. Field of the Invention

The present invention relates to an optical amplifier capable of amplifying signal light with multiple channels of mutually different wavelengths (WDM signal light), a gain control method for the optical amplifier, and a gain control circuit applicable to the optical amplifier.

2. Description of the Related Art

Utilization of a wavelength division multiplexing (WDM) communication system has been promoted aggressively in recent years in response to demands for increases in communication capacities. Meanwhile, in order to enhance reliability and efficiency of a network, optical add-drop multiplexers (OADM), optical cross-connects (OXC) and the like, which are designed to branch or insert part of the WDM signal light transmitted on the network, are being introduced in such a WDM communication system.

The WDM communication system must cope flexibly with variation in the number of signal channels on the network. Accordingly, flexibility to the variation in the number of signal channels on the network is also required in an optical amplifier such as an erbium-doped fiber amplifier (EDFA), which is widely used as a network constituent in the WDM communication system. Moreover, along with the widespread use of the WDM communication system as described above, it is extremely important to offer optical amplifiers to the market at low prices.

Nevertheless, as a method of controlling amplification gain, conventional optical amplifiers have generally adopted a method of calculating gain by use of a logarithmic amplifier, which is disclosed in Japanese Unexamined Patent Publication No. 2000-40847, for example. To be more concrete, automatic gain control (AGC) for calculating the gain by use of the logarithmic amplifier is conducted based on the following principle.

Specifically, gain of an optical amplifier is represented by the following formula (1):

$$G(dB) = P_{OUT}(dBm) - P_{IN}(dBm) \tag{1}$$

Here, G denotes the gain (unit: dB), $P_{IN}$ denotes a logarithmic value (unit: dBm) of inputted optical power, and $P_{OUT}$ denotes a logarithmic value (unit: dBm) of outputted optical power.

On an input side of the optical amplifier, an input-side photodetector outputs a voltage proportional to part of the optical power of signal light before amplification, and the voltage outputted from the input-side photodetector is subjected to logarithmic transformation by an input-side logarithmic amplifier (i.e. an output voltage $V_1$ from the input-side logarithmic amplifier is proportional to the logarithmic value of the optical power detected by the input-side photodetector). On the contrary, an output-side photodetector outputs a voltage proportional to part of the optical power of signal light after amplification, and the voltage outputted from the output-side photodetector is also subjected to logarithmic transformation by an output-side logarithmic amplifier (i.e. an output voltage $V_2$ from the output-side logarithmic amplifier is proportional to the logarithmic value of the optical power detected by the output-side photodetector). Thereafter, the gain of the optical amplifier is detected by subtraction of the obtained voltages $V_1$ and $V_2$ with a difference calculator. The detected gain and target gain are compared by use of a comparator, and gain control of the optical amplifier is conducted by adjustment of pumping light power, for example, such that the detected gain and the target gain coincide approximately with each other.

Meanwhile, in a case of performing automatic level control (ALC) of the optical amplifier, the gain of the optical amplifier is detected as described above, and the outputted optical power is calculated by the following formula (2):

$$P_{OUT}(dBm) = G(dB) + P_{IN}(dBm) \tag{2}$$

Thereafter, the outputted optical power thus obtained and the target outputted optical power are compared, and the pumping light power or the like is controlled such that the above-mentioned power values coincide with each other.

SUMMARY OF THE INVENTION

After the studies of the above-described prior art, the inventor of the present invention has found out the following problems.

In the gain control of the conventional optical amplifier, the voltage outputted from the photodetector is subjected to logarithmic transformation with the logarithmic amplifier, and then the gain detection is performed by use of the difference calculator which is readily feasible. However, the logarithmic amplifier is relatively expensive among electronic components. Moreover, a control circuit including the logarithmic amplifier constitutes a nonlinear control circuit which is difficult to design. For example, when the logarithmic amplifier is used, gain of the control circuit may fluctuate owing to the inputted optical power to be detected (i.e. the gain of the control circuit is increased as the power of the light inputted to the photodetector is reduced). Accordingly, the control circuit may become unstable upon an attempt to speed up in such a case, so that it is difficult to achieve high-speed gain control in a wide dynamic range.

The present invention has been made to solve the foregoing problems. An object of the invention is to provide an optical amplifier capable of achieving high-speed gain control in a wider dynamic range with a simpler constitution (with lower costs), a gain control method for the optical amplifier, and a gain control circuit applicable to the optical amplifier.

An optical amplifier according to the present invention includes an optical amplifier medium, a pumping light source, an input-side coupler (a first coupler) and an output-side coupler (a second coupler) disposed to sandwich the optical amplifier medium, and a gain control circuit. The optical amplifier medium includes an erbium-doped fiber (EDF), for example. The pumping light source supplies pumping light of a predetermined wavelength to the optical amplifier medium. The input-side coupler includes a branch port for separating part of signal light to be inputted to the optical amplifier medium. The output-side coupler includes a branch port for separating part of the signal light amplified in the optical amplifier medium. Moreover, the gain control circuit controls gain of the optical amplifier by use of difference information of power values between the light separated by the input-side coupler and the light separated by the output-side coupler. Here, gain control performed by the gain control circuit includes at least automatic gain control.

The gain control circuit includes an input-side photodetector (a first photodetector), an output-side photodetector (a second photodetector), a comparator (included in a control system), and a drive circuit. The input-side photodetector outputs a voltage having a linear relation with the power of the light separated by the input-side coupler. The output-side photodetector outputs a voltage having a linear relation with the power of the light separated by the output-side coupler. The comparator outputs a difference voltage obtained from the voltages outputted respectively from the input-side photodetector and the output-side photodetector. Moreover, the drive circuit supplies a desired drive current to the pumping light source such as a laser diode in response to the voltage outputted from the comparator.

Particularly, in order to perform the gain control of the optical amplifier, the gain control circuit adjusts an inclination $\underline{a}$ and an intercept $\underline{b}$ in a function ($V_o = a \cdot P_i + b$) for defining the linear relation between inputted optical power $P_i$ and an outputted voltage $V_o$ concerning at least one of the input-side photodetector and the output-side photodetector. Here, in order to perform the gain control only of the WDM signal light targeted for amplification, it is preferable that the adjustment of the inclination and the intercept is performed while considering optical power of noise light (mainly ASE light) contained in outputted light of the optical amplifier. Moreover, in order to avoid dynamic gain variation, it is preferable that response time in this gain control circuit is set into one second or less.

In addition to the above-described constitution, it is preferable that the optical amplifier according to the present invention further includes a temperature sensor for measuring an ambient temperature in environment where the input-side photodetector and the output-side photodetector is located. If the ambient temperature varies, there may be a case in which the linear relation between the inputted optical power and the outputted voltage also varies due to a temperature drift in the gain control circuit. Therefore, the gain variation attributable to the temperature variation can be suppressed effectively by adjusting the inclination or the intercept in the linear relation while monitoring the temperature variation properly (i.e. the voltage supplied from the comparator to the drive circuit is appropriately corrected based on a result of measurement by the temperature sensor).

Furthermore, the optical amplifier according to the present invention may also include a gain equalizer disposed between a signal output terminal of the optical amplifier medium and the output-side coupler. By providing the gain equalizer between the optical amplifier medium and the output-side coupler, wavelength dependence of the light separated by the output-side coupler (an object of detection by the output-side photodetector) is eliminated (the unevenness of the gain among respective signal channels is reduced). Accordingly, it is possible to control the gain of the WDM signal constantly irrespective of a change in the number of signal channels of the WDM signal light introduced to the optical amplifier medium.

In the gain control circuit for performing the gain control of the optical amplifier having the above-described constitution, such as the automatic gain control, with a simpler structure and in high speed (i.e. in the gain control circuit according to the present invention), it is preferable that the input-side photodetector, the output-side photodetector and the comparator respectively include circuit elements as follows. In particular, the input-side photodetector includes a photoelectric conversion element (a first photoelectric conversion element) such as a photodiode for converting the light separated by the input-side coupler into an electric current relevant to the power thereof, and an operational amplifier (a first operational amplifier) for converting the electric current outputted from the photoelectric conversion element into a voltage, the operational amplifier being capable of adjusting an offset of the outputted voltage. The output-side photodetector includes a photoelectric conversion element (a second photoelectric conversion element) such as a photodiode for converting the light separated by the output-side coupler into an electric current relevant to the power thereof, and an operational amplifier (a second operational amplifier) for converting the electric current outputted from the photoelectric conversion element into a voltage, the operational amplifier being capable of adjusting an offset of the outputted voltage. Meanwhile, the comparator includes a differential amplifier which receives the voltages outputted from the operational amplifiers respectively included in the input-side photodetector and the output-side photodetector. The differential amplifier outputs a difference voltage between the outputted voltages respectively of the input-side photodetector and of the output-side photodetector to the drive circuit. The drive circuit supplies the drive current to the pumping light source such as a laser diode in accordance with the voltage (the difference voltage) outputted from the comparator.

Particularly, in the gain control circuit according to the present invention, at least one of the input-side photodetector and the output-side photodetector includes an adjusting mechanism for adjusting at least the offset voltage. In other words, in the gain control circuit, at least one of the input-side photodetector and the output-side photodetector adjusts at least an intercept $\underline{b}$ out of an inclination $\underline{a}$ and the intercept $\underline{b}$ included in a function ($V_o = a \cdot P_i + b$) for defining a linear relation between inputted optical power $P_i$ and an outputted voltage Vo, in which the intercept b corresponds to the offset voltage.

Here, it is preferable that response time in this gain control circuit is also set into one second or less to avoid dynamic gain variation. Moreover, the above-described offset voltage adjustment is performed while considering the optical power of the noise light (mainly the ASE light) contained in the outputted light of the optical amplifier, in order to perform the gain control only of the WDM signal light targeted for amplification.

In addition to the above-described constitution, it is preferable that the gain control circuit according to the present invention further includes a temperature sensor for measuring an ambient temperature in an environment where at least one of the input-side photodetector and the output-side photodetector is located, in order to effectuate stable gain control against temperature variation.

Next, a gain control method according to the present invention is applied to gain control of an optical amplifier as described above for amplifying WDM signal light transmitted through an optical amplifier medium by supplying pumping light of a predetermined wavelength from a pumping light source.

In the gain control method according to the present invention, an inclination $\underline{a}$ and an intercept $\underline{b}$ in a function ($V_o = a \cdot P_i + b$) for defining a linear relation between inputted optical power $P_i$ and an outputted voltage $V_o$ is firstly adjusted by at least one of an input-side photodetector for receiving part of signal light to be inputted to an optical amplifier medium and an output-side photodetector for receiving part of signal light amplified in the optical amplifier medium. Thereafter, a drive circuit for supplying a drive current to a pumping light source is controlled by use of difference information of voltages respectively outputted from the input-side photodetector and the output-side photodetector.

Here, in the gain control method according to the present invention, the drive circuit is controlled based on the difference information of the voltages respectively outputted from the input-side photodetector and the output-side photodetector and on ambient temperature information of an environment where at least one of the input-side photodetector and the output-side photodetector is located, in order to effectuate stable gain control against temperature variation. Moreover, a voltage to be supplied to the drive circuit is adjusted so that amplification gain in the optical amplifier medium becomes constant. Response time from light detection by the input-side photodetector and the output-side photodetector to adjustment of output at the pumping light source is set into one second or less to avoid dynamic gain variation. More preferably, the adjustment of at least one of the inclination and the intercept is performed so as to eliminate influences of noise light contained in outputted light of the optical amplifier.

DETAILED DESCRIPTION OF THE PREFERRED EMBODIMENTS

Figure 1:
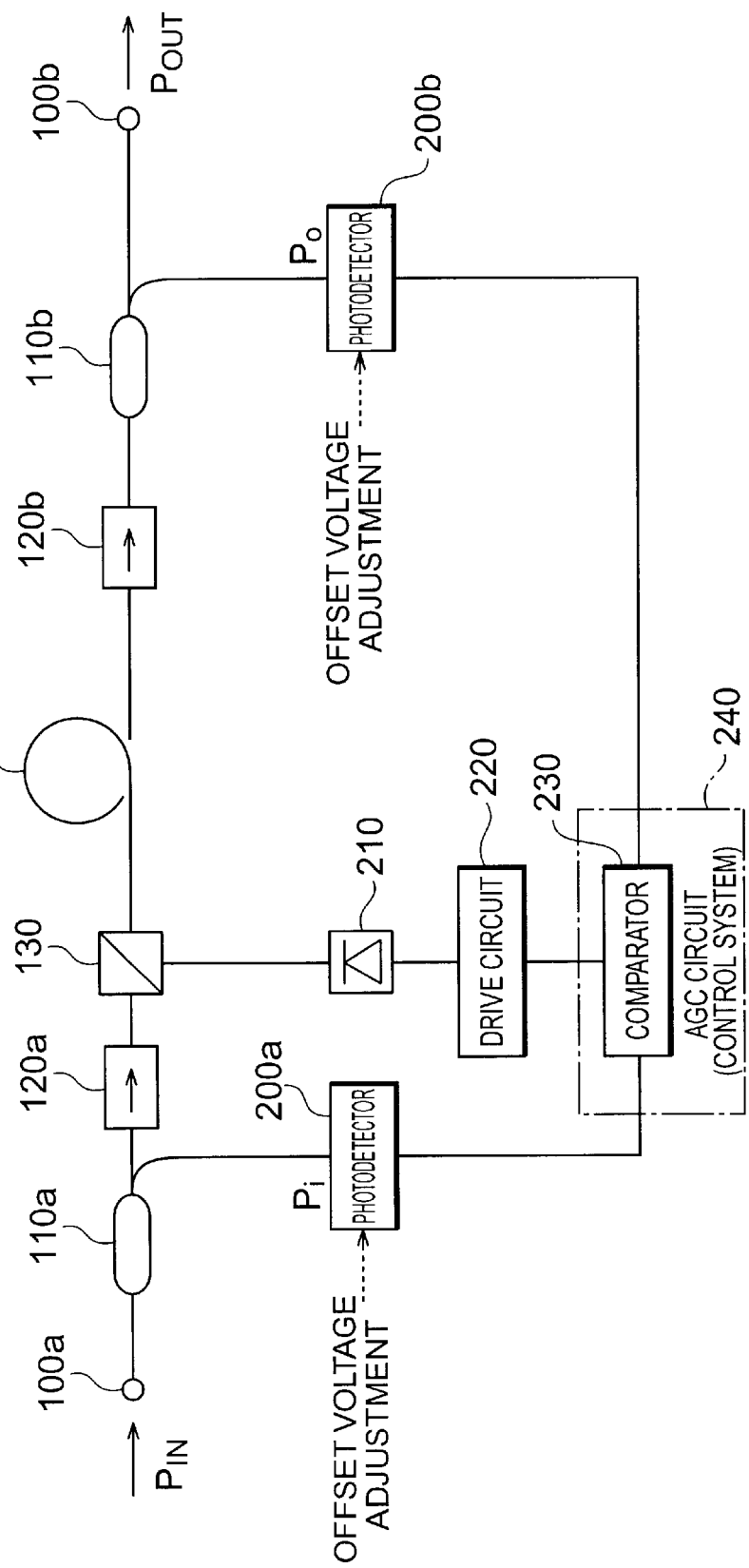
FIG. 1 is a view showing a constitution of a first embodiment of an optical amplifier according to the present invention.

Now, preferred embodiments of an optical amplifier and the like according to the present invention will be described in detail with reference to FIG. 1 to FIG. 5. Note that the same reference numerals are affixed to the same constituents throughout the description of the drawings, and repetitive explanation will be omitted herein.

FIG. 1 is a view showing a constitution of a first embodiment of an optical amplifier according to the present invention. As shown in FIG. 1, the optical amplifier according to the first embodiment includes an input-side coupler 110a, an optical isolator 120a, a multiplexer 130, an erbium-doped fiber (EDF) 140 that is an optical amplifier medium, another optical isolator 120b and an output-side coupler 10b, which are disposed in the order of enumeration from an input terminal 100a toward an output terminal 110b. Moreover, the optical amplifier further includes a laser diode (LD) 210 which is a pumping light source for supplying pumping light of a predetermined wavelength to the EDF 140, and a gain control circuit. The gain control circuit includes an input-side photodetector 200a, an output-side photodetector 200b, a comparator 230 included in an AGC circuit (a control system) 240 for performing automatic gain control, and a drive circuit 220.

The input-side coupler 110a includes a branch port for guiding part of WDM signal light taken in from the input terminal 100a toward the gain control circuit. Meanwhile, the output-side coupler 110b includes a branch port for guiding part of the WDM signal light amplified by the EDF 140 toward the gain control circuit.

The optical isolator 120a has functions to transmit the WDM signal light passing through the input-side coupler 110a toward the EDF 140, and to block light from the EDF 140 in the meantime. On the contrary, the optical isolator 120b has functions to transmit the WDM signal light amplified by the EDF 140 toward the output-side coupler 110b, and to block light from the output-side coupler 110b in the meantime.

The multiplexer 130 has a function to guide the pumping light from the LD 210 to the EDF 140 together with the WDM signal light.

As described above, the gain control circuit includes the input-side photodetector 200a, the output-side photodetector 200b, the comparator 230 and the drive circuit 220. The input-side photodetector 200a outputs a voltage having a linear relation with power $P_i$ of the light separated by the input-side coupler 110a. Meanwhile, the output-side photodetector 200b outputs a voltage having a linear relation with power $P_o$ of the light separated by the output-side coupler 110b. The comparator 230 included in the AGC circuit 240 outputs a difference voltage between the outputted voltages respectively from the input-side photodetector 200a and the output-side photodetector 200b. Moreover, the drive circuit 220 supplies a desired drive current to the LD 210 which is the pumping light source in response to the voltage outputted from the comparator 230.

In this constitution, the gain control circuit adjusts an inclination $\underline{a}$ and an intercept $\underline{b}$ in a function ($V_o = a \cdot P_i + b$) for defining the linear relation between inputted optical power Pi and an outputted voltage $V_o$ concerning at least one of the input-side photodetector 200a and the output-side photodetector 200b. Here, it is preferable that the adjustment of the inclination and the intercept is performed while considering optical power of noise light (mainly ASE light) contained in outputted light of the optical amplifier, in order to perform the gain control only of the WDM signal light targeted for amplification. Moreover, it is preferable that response time in this gain control circuit is set into one second or less to avoid dynamic gain variation.

Figure 2:
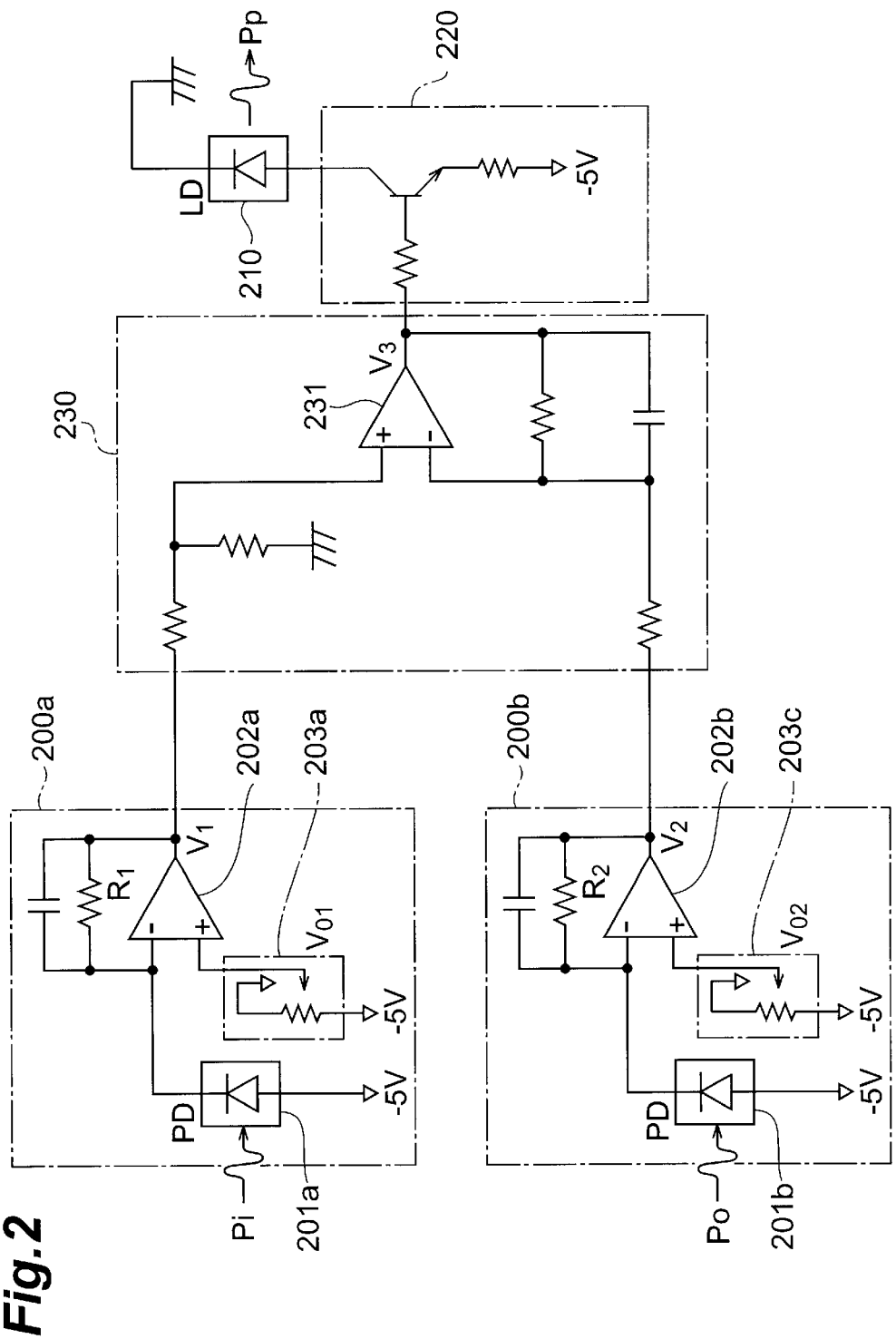
FIG. 2 is a view showing a basic constitution of a gain control circuit according to the present invention.

Next, FIG. 2 is a view showing a basic constitution of the gain control circuit according to the present invention. In the gain control circuit shown in FIG. 2, the input-side photodetector 200a includes a photodiode PD 201a for converting the separated light (of the power Pi) from the input-side coupler 110a into an electric signal, an offset voltage adjusting mechanism 203a capable of dynamically adjusting an offset voltage, and an operational amplifier 202a for receiving the electric signal from the PD 201a and the offset voltage and for outputting a voltage $V_1$ having the linear relation with the inputted optical power Pi.

The output-side photodetector 200b includes a photodiode PD 201b for converting the separated light (of the power Po) from the output-side coupler 110b into an electric signal, an offset voltage adjusting mechanism 203b capable of dynamically adjusting an offset voltage, and an operational amplifier 202b for receiving the electric signal from the PD 201b and the offset voltage and for outputting a voltage $V_2$ having the linear relation with the inputted optical power Po.

The comparator 230 includes a differential amplifier 231 for receiving the voltages $V_1$ and $V_2$ outputted respectively from the input-side photodetector 200a and the output-side photodetector 200b and for outputting a difference voltage $V_3$ therebetween. The drive circuit 220 supplies the drive current relevant to the difference voltage $V_3$ outputted from the comparator 230 to the LD 210. In this way, the pumping light of power $P_p$ is supplied from the LD 210 to the EDF 140 via the multiplexer 130.

Specifically, part of the signal light before amplification is separated by the input-side coupler 110a on an input side of the optical amplifier, and the voltage $V_1$ having the linear relation with the power of the separated light is outputted from the input-side photodetector 200a. On the contrary, part of the signal light after amplification is separated by the output-side coupler 110b on an output side of the optical amplifier, and the voltage $V_2$ having the linear relation with the power of the separated light is outputted from the output-side photodetector 200b. The voltages $V_1$ and $V_2$ outputted from the respective photodetectors 200a and 200b are respectively inputted to the differential amplifier 231 included in the comparator 230, and the difference voltage $V_3$ is outputted therefrom. Here, an operational amplifier, a differential amplifier using the operational amplifier or the like can be used as the comparator 230, for example. Moreover, the drive circuit 220 controls the pumping power $P_p$ of the LD 210, which is the pumping light source, based on the difference voltage $V_3$ from the comparator 230, whereby the gain of the optical amplifier is controlled.

Next, description will be made regarding automatic gain control (i.e. the gain control method according to the present invention) by the gain control circuit shown in FIG. 2.

First, the outputted voltage $V_1$ from the input-side photodetector 200a and the outputted voltage $V_2$ from the output-side photodetector 200b are respectively represented by the following formulae (3) and (4):

$$V_1 = R_1 \cdot T_1 \cdot P_i + V_{O1} \quad (3)$$

$$V_2 = R_2 \cdot T_2 \cdot P_o + V_{O2} \quad (4)$$

Here, $T_1$ and $T_2$ denote values of transmittance of the respective branch ports of the input-side and output-side couplers 110a and 110b, $P_i$ and $P_o$ denote values of optical power detected by the respective photodetectors 200a and 200b, $V_{O1}$ and $V_{O2}$ denote the offset voltages (the intercepts) of the respective photodetectors 200a and 200b, and $R_1$ and $R_2$ denote the inclinations (multiplied values of conversion rates (A/W) and resistance values (Ω) of the photodetectors).

Meanwhile, the difference voltage $V_3$ to be outputted from the differential amplifier 231 included in the comparator 230 is represented by the following formula (5):

$$V_3 = K(V_1 - V_2) \quad (5)$$

Here, K denotes gain of the differential amplifier 231.

Assuming that the gain K of the differential amplifier 231 is infinite (i.e. an ideal comparator) and $V_{O1} = V_{O2}$, then the following formula (6) is 4derived from the foregoing formula (3) to the formula (5):

$$P_{OUT}/P_{IN} = (i\ R_1 T_1)/(R_2 T_2) = G \quad (6)$$

Here, G denotes gain of the optical amplifier.

Accordingly, ideally speaking (where the gain K of the differential amplifier 231 is infinite), the gain G of the optical amplifier is determined by $R_1$ and $R_2$, and by the values of transmittance $T_1$ and $T_2$ of the respective branch ports of the input-side and output-side couplers 110a and 110b. However, in reality, the gain of the differential amplifier 231 is not infinite. Therefore, in the gain control method according to the present invention, the automatic gain control in a wide dynamic range is achieved by adjusting the offset voltages $V_{O1}$ and $V_{O2}$ (the offset voltage adjusting mechanisms 203a and 203b) in the formula (3) and the formula (4).

Here, in the gain control circuit shown in FIG. 2, variation of the gain of the optical amplifier is also feasible either by adjusting a ratio between R1 and R2 corresponding to the inclinations in the linear relation ($V_o = a \cdot P_i + b$) between the inputted optical power $P_i$ and the outputted voltage $V_o$, or by adjusting a ratio between the values of transmittance of $T_1$ and $T_2$ of the respective branch ports of the input-side and output-side couplers 110a and 110b, as it is clear from the foregoing formula (6). In this event, it is also necessary to adjust at least one of the offset voltages $V_{O1}$ and $V_{O2}$ of the respective photodetectors 200a and 200b. In any adjusting method, the gain control circuit does not require a logarithmic amplifier unlike the conventional gain control circuit. Accordingly, the gain control circuit of the present invention can be realized by a simpler constitution (at lower costs).

Meanwhile, an optical amplifier generally outputs noise light (mainly ASE light) as well in the event of amplification. Therefore, light outputted from the optical amplifier contains the noise light as well as amplified WDM signal light. In the optical amplifier, it is necessary to remove an influence of the noise light contained in the outputted light on the gain control in order to control amplification gain of the signal light with high precision. In order to remove the influence of the noise light, it is necessary to subtract a difference equivalent to a voltage corresponding to the noise light power from the voltage $V_2$ outputted from the output-side photodetector 200b. To be more precise, the influence of the noise light is removed by adjusting the intercept (the offset voltage $V_{O2}$) in the formula (4).

Figure 3:
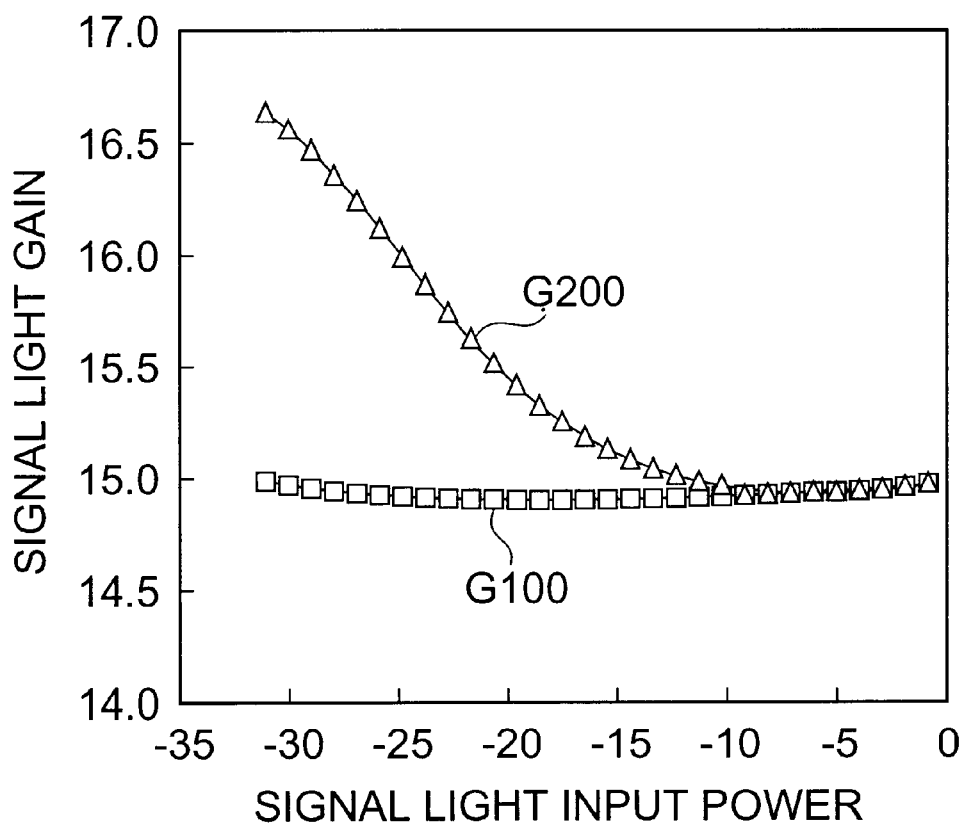
FIG. 3 is a view for explaining an effect of a gain control method according to the present invention.

Next, FIG. 3 is a view for explaining an effect of the gain control method according to the present invention. FIG. 3 is a graph for explaining that the gain control (the automatic gain control) can be achieved in a wide dynamic range by relatively adjusting the respective offset voltages $V_{O1}$ and $V_{O2}$ of the input-side photodetector 200a and the output-side photodetector 200b. Here, in FIG. 3, a graph G100 shows a relation between signal light input power (dBm) and signal light gain (dB) in the case where the relative adjustment of the offset voltages takes place, and a graph G200 shows the same relation in the case where the adjustment of the offset voltages does not take place.

As it can be understood from FIG. 3, in the case where the adjustment of the offset voltage does not take place in the gain control circuit shown in FIG. 2 (the graph G200: the case without a relative difference between the respective offset voltages of the input-side photodetector 200a and the output-side photodetector 200b), the signal light gain (dB) is increased more as the signal light input power (dBm) is decreased more. On the contrary, in the case of adjusting the offset voltage of the output-side photodetector 200b relatively to the offset voltage of the input-side photodetector 200a (the graph G100), the signal light gain (dB) can be controlled almost constantly irrespective of the variation of the signal light input power (dBm) in the gain control circuit shown in FIG. 2. Therefore, the relative adjustment of the offset voltages between the input-side photodetector 200a and the output-side photodetector 200b is essential to achieve the highly accurate gain control in a wide dynamic range. In other words, it is essential to adjust the intercept $\underline{b}$ relatively in light of the linear relation ($V_o = a \cdot P_i + b$) between the power $P_i$ of the light inputted to the respective photodetectors 200a and 200b, and the voltages $V_o$ to be outputted.

Note that the offset voltages in the respective photodetectors 200a and 200b should be adjusted relatively. Accordingly, it is sufficient if at least one of the offset voltages of the photodetectors 200a and 200b is adjusted relative to the other offset voltage.

Figure 4:
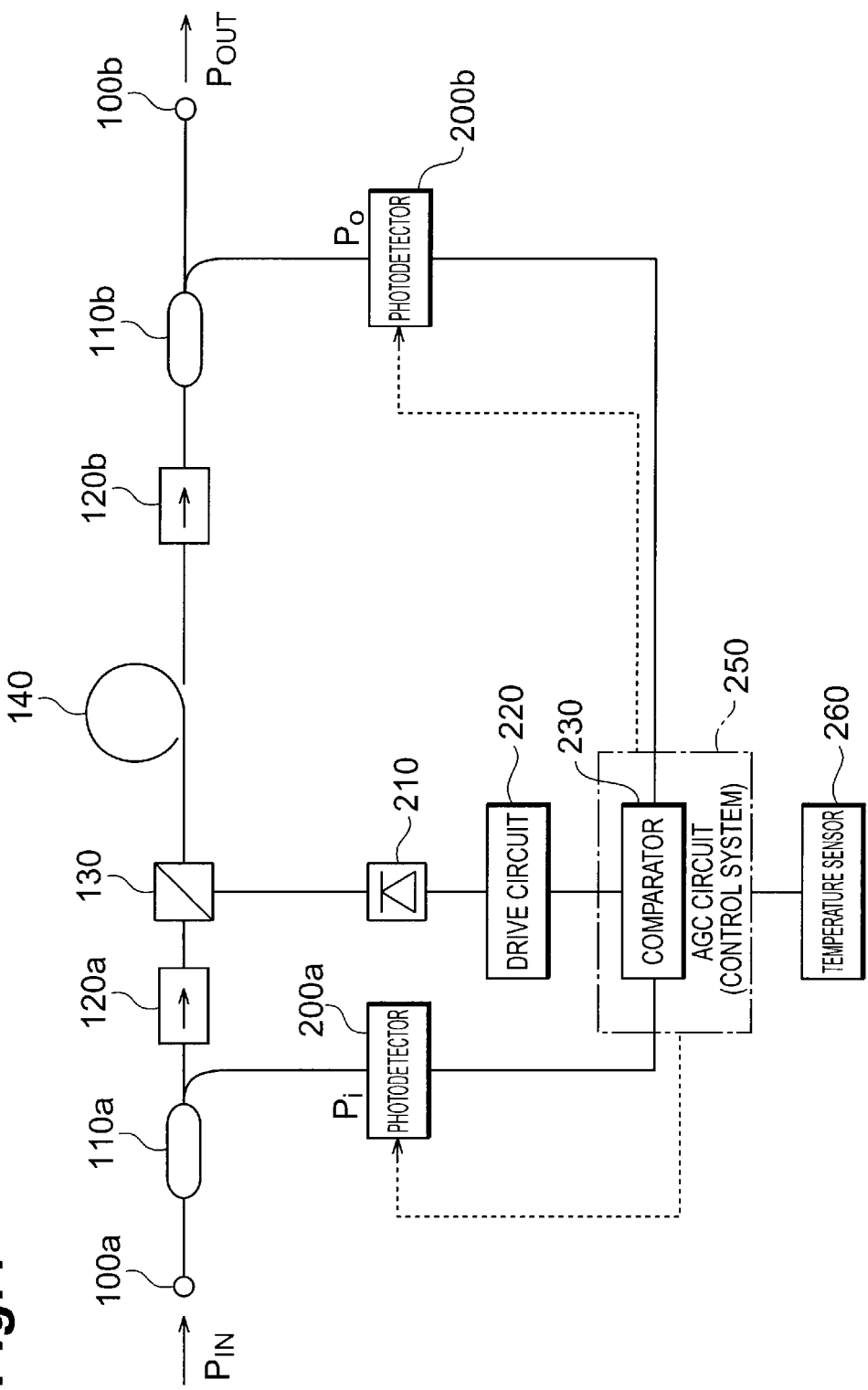
FIG. 4 is a view showing a constitution of a second embodiment of the optical amplifier according to the present invention.

FIG. 4 is a view showing a constitution of a second embodiment of the optical amplifier according to the present invention. The optical amplifier according to the second embodiment includes an input-side coupler 110a, an optical isolator 120a, a multiplexer 130, an erbium-doped fiber (EDF) 140 that is an optical amplifier medium, another optical isolator 120b and an output-side coupler 110b, which are disposed in the order of enumeration from an input terminal 100a toward an output terminal 100b as similar to the first embodiment. Moreover, the optical amplifier further includes a laser diode (LD) 210 which is a pumping light source for supplying pumping light of a predetermined wavelength to the EDF 140, and a gain control circuit controlling gain of the optical amplifier such as automatic gain control. Moreover, the gain control circuit includes an input-side photodetector 200a, an output-side photodetector 200b, a comparator 230 included in an AGC circuit (a control system) 250 for performing the automatic gain control, and a drive circuit 220. The basic constitution thereof is similar to that of the gain control circuit shown in FIG. 2.

In particular, the optical amplifier according to the second embodiment is different from the first embodiment in that the optical amplifier further includes a temperature sensor 260 for measuring an ambient temperature in an environment where at least one of the input-side photodetector 200a and the output-side photodetector 200b is located. The AGC circuit 250 in the second embodiment is provided with a constitution for correcting a voltage serially based on a result of measurement by the temperature sensor 260, the voltage being supplied from the comparator 230 included in the AGC circuit 250 to the drive circuit 220.

When the temperature varies, there maybe a case where the relations represented by the formula (3) and the formula (4) also vary owing to a temperature drift in the gain control circuit. If the relations represented by the formula (3) and the formula (4) vary, then the amplification gain of the optical amplifier varies as well. Therefore, the optical amplifier (FIG. 4) according to the second embodiment includes the temperature sensor 260 in order to stably control the gain against the temperature variation. Moreover, based on the result of measurement, the AGC circuit 250 adjusts the inclination or the intercept of at least one of the formula (3) and the formula (4). To be more precise, the gain control circuit shown in FIG. 2 is provided with offset voltage adjusting mechanisms 203a and 203b for adjusting the offset voltages (which correspond to the intercepts in the formula (3) and the formula (4)) on one or both of the input-side photodetector 200a and the output-side photodetector 200b. Accordingly, these adjusting mechanisms 203a and 203b are relatively adjusted by the AGC circuit 250 (here, it is not necessary to adjust both of the offset voltages; if one of the offset voltages is fixed, then the other offset voltage is only adjusted).

Figure 5:
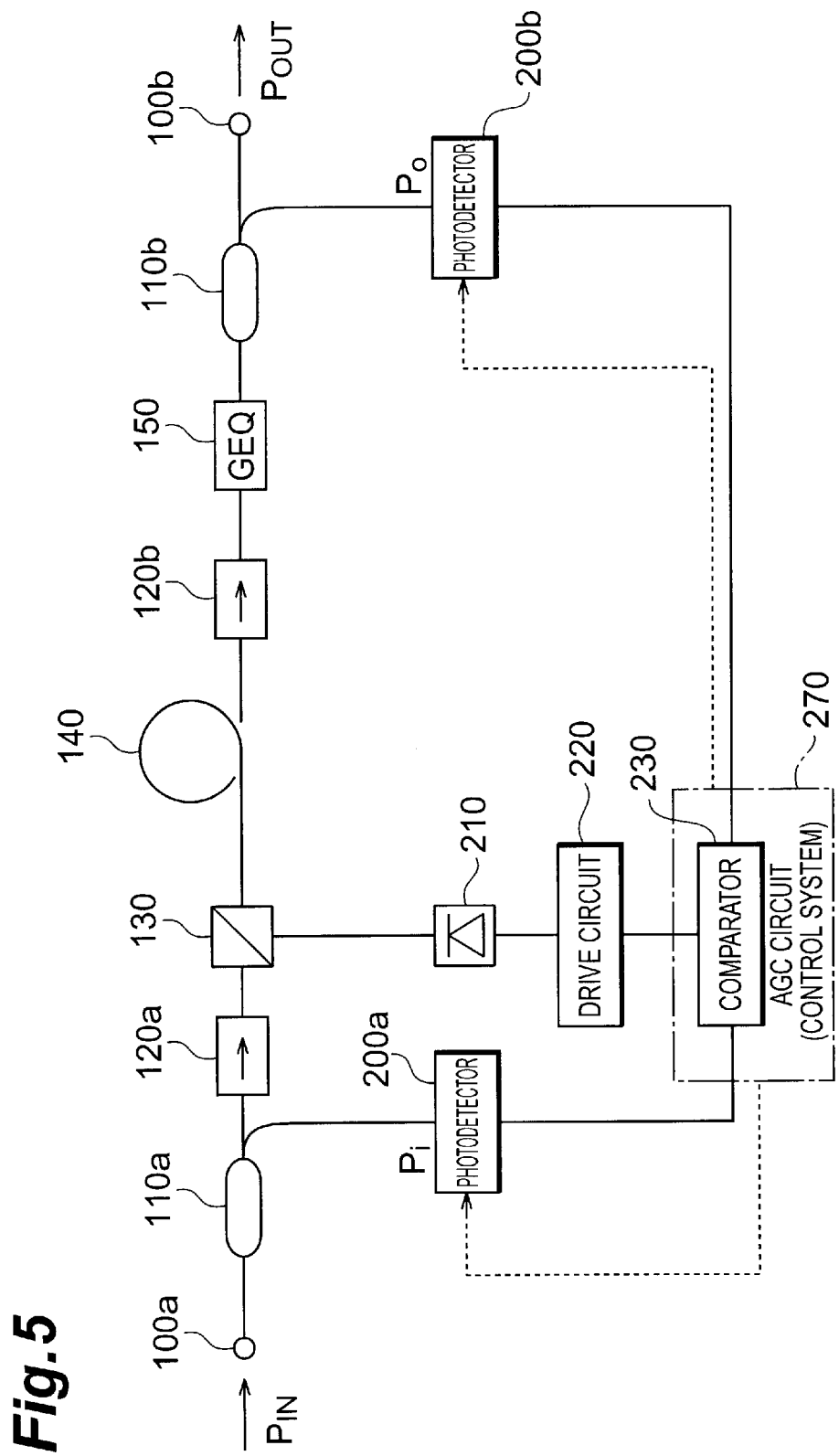
FIG. 5 is a view showing a constitution of a third embodiment of the optical amplifier according to the present invention.

Next, FIG. 5 is a view showing a constitution of a third embodiment of the optical amplifier according to the present invention. The optical amplifier according to the third embodiment also includes an input-side coupler 110a, an optical isolator 120a, a multiplexer 130, an erbium-doped fiber (EDF) 140 that is an optical amplifier medium, another optical isolator 120b and an output-side coupler 110b, which are disposed in the order of enumeration from an input terminal 100a toward an output terminal 100b as similar to the first and second embodiments. Moreover, the optical amplifier further includes a laser diode (LD) 210 which is a pumping light source for supplying pumping light of a predetermined wavelength to the EDF 140, and a gain control circuit for controlling gain of the optical amplifier such as automatic gain control. Moreover, the gain control circuit includes an input-side photodetector 200a, an output-side photodetector 200b, a comparator 230 included in an AGC circuit (a control system) 270 for performing the automatic gain control, and a drive circuit 220. The basic constitution thereof is similar to that of the gain control circuit shown in FIG. 2.

In particular, the optical amplifier according to the third embodiment is different from the second embodiment in that the optical amplifier further includes a gain equalizer (GEQ) 150 provided between an signal output terminal of the EDF 140 and the output-side coupler 110b. In the third embodiment, the AGC circuit 270 is constituted so as to monitor the signal light before amplification and the signal light after amplification, and to adjust the offset voltages of the input-side photodetector 200a and the output-side photodetector 200b serially. However, the AGC circuit 270 may also adopt the constitution similar to the first embodiment, in which the offset voltages of the respective photodetectors 200a and 200b are adjusted in advance.

The EDF 140 which is the optical amplifier medium has dependence with respect to the gain on wavelength. Therefore, the optical amplifier according to the third embodiment includes the GEQ 150 having a loss spectrum of the same shape as a gain spectrum of the EDF 140 in order to reduce uneven gain attributable to the wavelength upon amplification of the WDM signal light. It is preferable that the GEQ 150 is provided between the signal output terminal of the EDF 140 and the output-side coupler 110b. If the GEQ 150 is provided in a downstream of the output-side coupler 110b (in a space between the output-side coupler 110b and the output terminal 100b) or if the GEQ 150 is not applied, the light separated by the output-side coupler 110b (the object of detection by the output-side photodetector 200b) retains unevenness among respective signal channels notwithstanding that the WDM signal light inputted to the optical amplifier shows uniform levels in respective wavelength channels. In this case, the gain of the optical amplifier is controlled such that average gain of the WDM signal light has a desired value. Accordingly, it is probable that the gain of the signal light on one channel may be different from the average gain of the WDM signal light on a plurality of channels. Therefore, if the number of channels of the inputted WDM signal light is changed, then the average gain of the WDM signal is also changed. Thus, the gain control circuit would control the gain of the optical amplifier such that the modified average gain has a desired value. As a result, it is probable that the gain of the WDM signal light in the respective signal channels may be changed.

Meanwhile, in the optical amplifier according to the third embodiment, the GEQ 150 is provided between the EDF 140 and the output-side coupler 110b as shown in FIG. 5. Therefore, dependence of the light separated by the output-side coupler 110b (the object of detection by the output-side photodetector 200b) on wavelength is eliminated (i.e. the unevenness of the gain among the respective signal channels is reduced), whereby the gain of the WDM signal light transmitted on the EDF 140 can be controlled constantly even if the number of the signal channels of the WDM signal light is changed.

Here, if the values of transmittance $T_1$ and $T_2$ of the respective branch ports of the input-side and the output-side couplers 110a and 110b have dependence on wavelength, the gain among the respective signal channels of the inputted WDM signal light becomes uneven (see the formula (3) or the formula (4)). For example, in order to suppress the gain variation among the respective signal channels into ±1 dB or less at a signal wavelength bandwidth of 30 nm, it is necessary to restrain a difference between dependence of the transmittance $T_1$ of the branch port of the input-side coupler 110a on wavelength and dependence of the transmittance $T_2$ of the branch port of the output-side coupler 110b on wavelength into ±1 dB/30 nm or less. Moreover, in order to control the gain among the respective signal channels constantly without dependence on channel wavelengths, the input-side coupler 110a and the output-side coupler 110b must adopt the branch ports having the values of transmittance $T_1$ and $T_2$ without dependence on wavelength or of the same value.

Such an optical amplifier is suitable for an optical communication system for transmitting the WDM signal light, more specifically, for a system including means for achieving channel separation or channel insertion in the WDM signal light.

As described above, according to the present invention, in the photodetectors for detecting parts of the signal light before amplification and the signal light after amplification respectively as electric signals, the linear relation between the inputted optical power and the outputted voltage is adjusted previously or serially, whereby the outputs from the photodetectors are used as input data for the gain control. In this way, it is possible to realize a linear control circuit without a requirement of a logarithmic amplifier as in the prior art (the gain in the control circuit is made constant without dependence on the inputted optical power), and to perform high-speed gain control with a simpler constitution (at lower costs)

What is claimed is:

1. An optical amplifier comprising:
   an optical amplifier medium;
   a pumping light source for supplying pumping light of a predetermined wavelength to said optical amplifier medium;
   a first coupler for separating part of signal light to be inputted to said optical amplifier medium;
   a second coupler provided so as to sandwich said optical amplifier medium together with said first coupler, said second coupler separating part of the signal light amplified in said optical amplifier medium; and
   a gain control circuit for controlling a gain of said optical amplifier by use of information concerning power of the light respectively separated by said first and second couplers,
   wherein said gain control circuit includes:
      a first photodetector for outputting a voltage having a linear relation with the power of the light separated by said first coupler;
      a second photodetector for outputting a voltage having a linear relation with the power of the light separated by said second coupler;
      a comparator for outputting a difference voltage between the voltages respectively outputted from said first and second photodetectors; and
      a drive circuit for supplying a desired drive current to said pumping light source in response to the voltage outputted from said comparator, and
   wherein said gain control circuit has a structure for performing gain control by adjusting an inclination a and an intercept b in a function ($V_o$=a·$P_i$+b) for defining the linear relation between inputted optical power $P_i$ and an outputted voltage $V_o$ concerning said first and second photodetectors.

2. An optical amplifier according to claim 1, wherein said first photodetector includes:
   a first photoelectric conversion element for converting the light separated by said first coupler into an electric current relevant to the power thereof; and
   a first operational amplifier for converting the electric current outputted from said first photoelectric conversion element into a voltage,
   wherein said second photodetector includes:
      a second photoelectric conversion element for converting the light separated by said second coupler into an electric current relevant to the power thereof; and
      a second operational amplifier for converting the electric current outputted from said second photoelectric conversion element into a voltage, and
      wherein at least one of said first and second photodetectors includes an adjusting mechanism for adjusting an offset of the voltage to be outputted.

3. An optical amplifier according to claim 1, wherein said comparator in said gain control circuit includes a differential amplifier for receiving the voltages outputted from said first and second operational amplifiers respectively included in said first and second photodetectors.

4. An optical amplifier according to claim 1, further comprising a temperature sensor for measuring an ambient temperature in an environment where at least one of said first and second photodetectors is located,
   wherein the linear relation between the optical power and the outputted voltage in said first and second photodetectors is corrected based on a result of measurement by said temperature sensor.

5. An optical amplifier according to claim 1, further comprising a gain equalizer provided between a signal output terminal of said optical amplifier medium and said second coupler.

6. An optical amplifier according to claim 1, wherein said gain control circuit has response time of one second or less.

7. An optical amplifier according to claim 1, wherein said gain control circuit performs automatic gain control.

8. An optical amplifier according to claim 1, wherein the inclination and the intercept is adjusted so as to eliminate an influence of noise light contained in light outputted from said optical amplifier.

9. An optical amplifier according to claim 1, wherein an absolute value of a difference between dependence of transmittance $T_1$ of a branch port in said first photodetector on wavelength and dependence of transmittance $T_2$ of a branch port in said second photodetector on wavelength is 1 dB or less at a band width of 30 nm.

10. A gain control method for an optical amplifier which amplifies signal light of mutually different wavelengths transmitted on an optical amplifier medium, by supplying pumping light of a predetermined wavelength from a pumping light source, said gain control method comprising the steps of:
   adjusting at least one of an inclination a and an intercept b in a function ($V_o$=a·$P_i$+b) for defining a linear relation between inputted optical power $P_i$ and an outputted voltage $V_o$ in at least one of a first photodetector for receiving part of signal light to be inputted to said optical amplifier medium and a second photodetector for receiving part of signal light amplified in said optical amplifier medium; and
   controlling a drive circuit for supplying a drive current to said pumping light source by use of difference information of voltages respectively outputted from said first and second photodetectors.

11. A gain control method according to claim 10, wherein the drive circuit is controlled based on the difference information of the voltages respectively outputted from the first and second photodetectors and on ambient temperature information of environment where at least any one of the first and second photodetectors is located.

12. A gain control method according to claim 10, wherein a voltage to be supplied to the drive circuit is adjusted so that an amplification gain in the optical amplifier medium becomes constant.

13. A gain control method according to claim 10, wherein response time from light detection by the first and second photodetectors to adjustment of output at said pumping light source is set into one second or less.

14. A gain control method according to claim 10, wherein any of the inclination and the intercept is adjusted so as to eliminate an influence of noise light contained in light outputted from the optical amplifier.

15. A gain control method according to claim 10, wherein an absolute value of a difference between dependence of transmittance $T_1$ of a branch port in said first photodetector on wavelength and dependence of transmittance $T_2$ of a branch port in said second photodetector on wavelength is 1 dB or less at a band width of 30 nm.

16. A gain control method according to claim 10, wherein the part of the signal light, which is amplified by said optical amplifier medium and detected by said second photodetector, shows reduced unevenness for each wavelength.

17. A gain control circuit applied to an optical amplifier for amplifying signal light of mutually different wavelengths transmitted on an optical amplifier medium, by supplying pumping light of a predetermined wavelength from a pumping light source, said gain control circuit comprising:

a first photodetector for outputting a voltage having a linear relation with power of part of signal light to be inputted to said optical amplifier medium, said first photodetector including a first photoelectric conversion element for converting the part of the signal light to be inputted thereto into an electric current relevant to the power thereof, and a first operational amplifier for converting the electric current outputted from said first photoelectric conversion element into a voltage;

a second photodetector for outputting a voltage having a linear relation with power of part of the signal light amplified in said optical amplifier medium, said second photodetector including a second photoelectric conversion element for converting the part of the amplified signal light into an electric current relevant to the power thereof, and a second operational amplifier for converting the electric current outputted from said second photoelectric conversion element into a voltage;

a comparator for outputting a difference between the voltages respectively outputted from said first and second photodetectors, said comparator including a differential amplifier for receiving the voltages outputted from said first and second operational amplifiers respectively included in said first and second photodetectors; and a drive circuit for supplying a desired drive current to said pumping light source in response to a voltage outputted from said comparator, wherein at least one of said first and second photodetectors further includes an adjusting mechanism for adjusting at least an offset of the voltage to be outputted.

18. A gain control circuit according to claim 17, wherein said gain control circuit has response time of one second or less.

19. A gain control circuit according to claim 17, wherein said gain control circuit performs automatic gain control.

20. A gain control circuit according to claim 17, wherein said adjusting mechanism adjusts the offset of the voltage so as to eliminate an influence of noise light contained in light outputted from said optical amplifier.

21. A gain control circuit according to claim 17, further comprising a temperature sensor for measuring an ambient temperature in environment where at least one of said first and second photodetectors is located, wherein said drive circuit is controlled based on the difference information of the voltages respectively outputted from said first and second photodetectors and on a result of measurement by said temperature sensor.

22. A gain control circuit according to claim 17, wherein an absolute value of a difference between dependence of transmittance $T_1$ of a branch port in said first photodetector on wavelength and dependence of transmittance $T_2$ of a branch port in said second photodetector on wavelength is 1 dB or less at a wavelength width of 30 nm.

* * * * *